United States Patent
Kang

(10) Patent No.: US 7,889,566 B2
(45) Date of Patent: Feb. 15, 2011

(54) FLASH MEMORY DEVICE, PROGRAMMING METHOD THEREOF AND MEMORY SYSTEM INCLUDING THE SAME

(75) Inventor: Sang-ku Kang, Suwon (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 47 days.

(21) Appl. No.: 12/466,616

(22) Filed: May 15, 2009

(65) Prior Publication Data

US 2009/0285024 A1 Nov. 19, 2009

(30) Foreign Application Priority Data

May 15, 2008 (KR) .................... 10-2008-0044848

(51) Int. Cl.
*G11C 16/06* (2006.01)

(52) U.S. Cl. ............................. 365/185.22; 365/185.03

(58) Field of Classification Search ............ 365/185.03, 365/185.22
See application file for complete search history.

(56) References Cited

U.S. PATENT DOCUMENTS

| | | | |
|---|---|---|---|
| 6,426,892 B2 * | 7/2002 | Shibata et al. | 365/185.03 |
| 2007/0183210 A1 | 8/2007 | Choi et al. | |
| 2008/0158966 A1 * | 7/2008 | Chen et al. | 365/185.16 |
| 2008/0225597 A1 * | 9/2008 | Park | 365/185.22 |

FOREIGN PATENT DOCUMENTS

| | | |
|---|---|---|
| JP | 2006-024345 | 1/2006 |
| JP | 2007-207343 | 8/2007 |
| JP | 2007-207416 | 8/2007 |
| KR | 10-0732631 B1 | 6/2007 |

* cited by examiner

*Primary Examiner*—Hoai V Ho
(74) *Attorney, Agent, or Firm*—Muir Patent Consulting, PLLC

(57) ABSTRACT

A verify voltage may be changed into a plurality of voltage levels based upon a logic state of each of the memory cells and characteristics or logic states of other memory cells (e.g., adjacent) to each of the memory cells.

16 Claims, 10 Drawing Sheets

| MC2 | MC1 | MC3 | Verify Voltage of MC2 |
|---|---|---|---|
| P1 | P1 or E | P1 or E | Vver1 |
| | P3 | P3 | Vver1″ (i.e. ΔV=300mV) |
| | P2 | P3 | |
| | P1 or E | P3 | Vver1′ (i.e. ΔV=200mV) |
| | P2 | P2 | |
| | P1 or E | P2 | |
| P2 | P1, P2, or E | P1, P2, or E | Vver2 |
| | P3 | P3 | Vver2′ (i.e. ΔV=100mV) |
| | P1, P2, or E | P3 | |
| P3 | P1, P2, P3 or E | P1, P2, P3 or E | Vver3 |

| MC2 | MC1 | MC3 | Verify Voltage of MC2 |
|---|---|---|---|
| P1 | P1 or E | P1 or E | Vver1 |
|    | P3 | P3 | Vver1" (i.e. ΔV=300mV) |
|    | P2 | P3 |  |
|    | P1 or E | P3 |  |
|    | P2 | P2 | Vver1' (i.e. ΔV=200mV) |
|    | P1 or E | P2 |  |
| P2 | P1, P2, or E | P1, P2, or E | Vver2 |
|    | P3 | P3 | Vver2' (i.e. ΔV=100mV) |
|    | P1, P2, or E | P3 |  |
| P3 | P1, P2, P3 or E | P1, P2, P3 or E | Vver3 |

FLASH MEMORY DEVICE, PROGRAMMING METHOD THEREOF AND MEMORY SYSTEM INCLUDING THE SAME

CROSS-REFERENCE TO RELATED APPLICATIONS

This U.S. non-provisional patent application claims priority under 35 U.S.C. §119 of Korean Patent Application No. 10-2008-0044848 filed on May 15, 2008, the entirety of which is hereby incorporated by reference.

BACKGROUND

1. Field of the Invention

The present general inventive concept relates to a semiconductor memory device.

2. Description of Related Art

Semiconductor memory device may be a storage unit to store data and output the stored data as necessary or as desired. Semiconductor memory devices may be classified into non-volatile memory devices and volatile memory devices.

The volatile memory devices may be a memory device that loses stored data without power. The volatile memory devices may include SRAM, DRAM, SDRAM, or the like. The non-volatile memory devices may be a memory device that retains stored data even without power. The non-volatile memory devices may include ROM, PROM, EPROM, EEPROM, flash memory device, FRAM, PRAM, MRAM, RRAM, and the like.

Flash memory devices may be classified into a NAND flash memory device and a NOR flash memory device based upon interconnection between memory cells and bit lines. The NAND flash memory device may be used as a mass storage unit.

Memory cells of a flash memory device may include floating gates or charge trap layers placed between a bulk area and control gates. The flash memory device may store data by adjusting threshold voltages of memory cells via accumulation of charge on floating gates or trapping charge on charge trap layers. Accurate control of threshold voltages is desirable in flash memory devices.

SUMMARY OF THE INVENTION

The present general inventive concept may provide a flash memory device and a programming method thereof.

The present general inventive concept may provide a flash memory device and a program method to reduce and/or compensate variations of threshold voltages of memory cells.

The present general inventive concept may provide a flash memory device and a program method to reduce and/or compensate variations of threshold voltages of memory cells adjacent to memory cells to be programmed.

The present general inventive concept may provide a flash memory device and a program method to selectively control a verify condition such as a program fail state for threshold voltage distributions for a logic state.

Additional aspects and/or utilities of the present general inventive concept will be set forth in part in the description which follows and, in part, will be obvious from the description, or may be learned by practice of the present general inventive concept.

The foregoing and/or other aspects and utilities of the present general inventive concept may be achieved by providing a program method of a flash memory device that can include programming memory cells to have at least one of a plurality of logic states and verifying the programmed memory cells using a verify voltage, where the verify voltage includes a plurality of voltage levels based upon a logic state of each of the memory cells and logic states of at least one memory cell adjacent to the each of the memory cells.

The foregoing and/or other aspects and utilities of the present general inventive concept may be achieved by providing a method of operating a non-volatile memory device, the method may include providing a first verification voltage to a first memory cell of a plurality of memory cells, the first memory cell to be programmed to a first logic state, and providing a second different verification voltage to a second memory cell of the plurality of memory cells, the second memory cell to be programmed to a first logic state.

The foregoing and/or other aspects and utilities of the present general inventive concept may be achieved by providing a computer-readable recording medium storing a program for implementing a method of verifying multi-bit write data programmed to a multi-level memory cell, the method may include calculating a change in threshold voltage based on source data of at least one neighboring memory cell, converting a verify voltage based on the calculated change of the threshold voltage and verifying using the converted verify voltage.

The foregoing and/or other aspects and utilities of the present general inventive concept may be achieved by providing a flash memory device that may include an array of memory cells each to store one of a plurality of logic states, a buffer circuit to write program data in the memory cells and a verify level control circuit to change a verify voltage based upon logic states to be programmed in the memory cells and logic states to be programmed in memory cells adjacent to the memory cells.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION OF EMBODIMENTS

Figure 1:
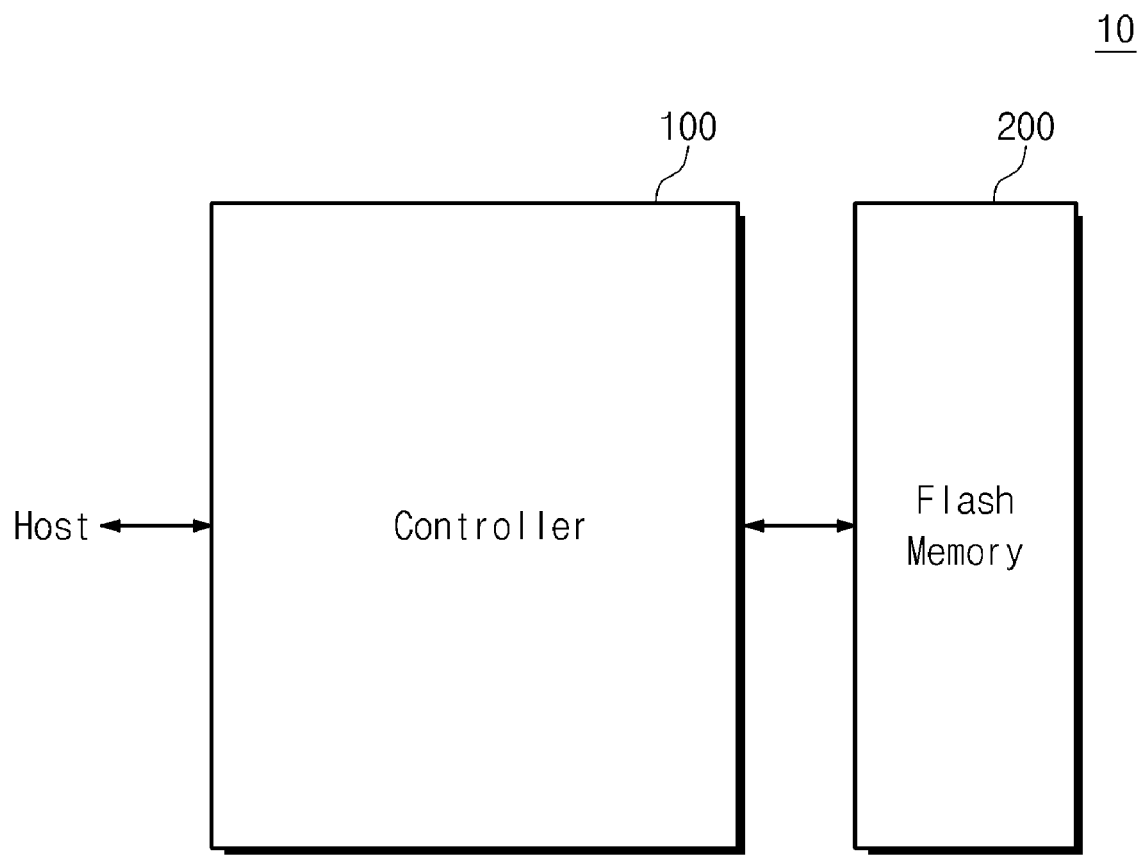
FIG. 1 is a block diagram showing a memory system according to example embodiments.

Example embodiments will be described in more detail with reference to the accompanying drawings. Example embodiments may, however, be embodied in different forms and should not be construed as limited to the embodiments set forth herein. Rather, these example embodiments are provided so that this disclosure will be thorough and complete, and will fully convey the scope of the example embodiments to those skilled in the art. In the figures, the dimensions of elements or regions may be exaggerated for clarity of illustration. Like reference numerals refer to like elements throughout.

A flash memory device according to example embodiments may be configured to perform a program operation using one or more verify voltages while memory cells are programmed to have one of a plurality of logic states. This will be described in greater detail.

FIG. 1 is a block diagram showing a memory system according to example embodiments. A memory system 10 according to example embodiments may include a controller 100 and a flash memory device 200.

The controller 100 may be connected to a host and the flash memory device 200. The controller 100 may transfer data read out from the flash memory device 200 to the host or store data transferred from the host in the flash memory device 200.

Although not illustrated in FIG. 1, the controller 100 may include RAM, a processing unit, a host interface, a memory interface, and an ECC block. The RAM may be used as an operating memory of the processing unit. The processing unit may control an overall operation of the controller 100. The host interface may include a protocol for data exchange between the host and the controller 100. In example embodiments, the controller 100 may be configured to communicate with the host via one or more protocols selected from a group of interface protocols such as USB, MMC, PCI-E, ATA, SATA, PATA, SCSI, ESDI, and IDE. The memory interface may interface with the flash memory device 200. The ECC block may detect and correct an error of data read out from the flash memory device 200. Constituent elements of the controller 100 are well known in the art, and description thereof is thus omitted.

The controller 100 and the flash memory device 200 in the memory system 10 may be integrated to form a card or a semiconductor device according to example embodiments. Further, the memory system 10 may be Solid State Disk/Drive (SSD) that uses non-volatile memory devices to store data.

Figure 2:
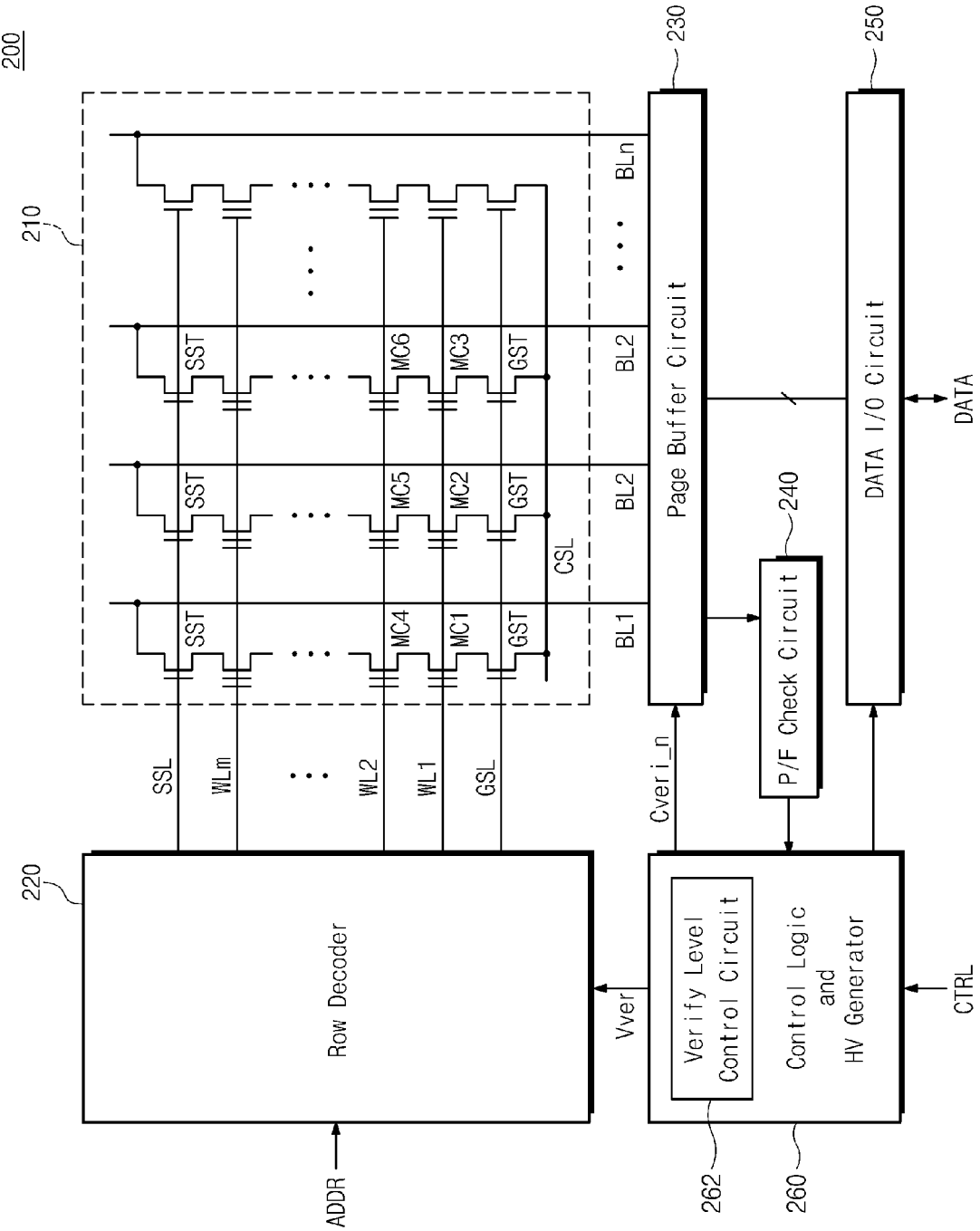
FIG. 2 is a block diagram showing an exemplary flash memory device in FIG. 1.

FIG. 2 is a block diagram showing an exemplary flash memory device, which may be used in the memory system of FIG. 1 according to example embodiments. As shown in FIG. 2, a flash memory device 200 according to example embodiments may include a memory cell array 210, a row decoder 220, a page buffer circuit 230, a pass/fail check circuit 240, a data input/output circuit 250, and a control logic and high voltage generator block 260.

The memory cell array 210 may connect to the row decoder 220 via a plurality of word lines WL1 to WLm, a string select line SSL and a ground select line GSL. Further, the memory cell array 210 may connect with the page buffer circuit 230 via a plurality of bit lines BL1 to BLn.

The memory cell array 210 may include a plurality of cell strings, each of which to include or consist of serially connected memory cells MC. Ground select transistors GST may connect between each cell string and a common source line CSL, and string select transistors SST may connect between the cell strings and the bit lines BL1 to BLn. The string select transistors SST may commonly connect to the string select line SSL, and the ground select transistors GST may commonly connect to the ground select line GSL. Such transistors may be commonly connected via a gate electrode. The memory cells may connect to corresponding word lines WL1 to WLm, respectively.

In exemplary embodiments, memory cells MC of the flash memory device 200 according to example embodiments may be programmed to have one of a plurality of logic states. For example, memory cells of the flash memory device 200 according to example embodiments may be a multi-level cell. Further, the flash memory device 200 according to example embodiments may use a plurality of verify voltages Vver to program the memory cells MC with one of a plurality of logic states. For example, memory cells MC may be programmed using two, three or more verify voltages being different from one another. An exemplary program operation for memory cells according to example embodiments will be described herein.

As shown in FIG. 2, the row decoder 220 may be connected to the memory cell array 210 via the lines SSL, WL1 to WLm, and GSL and to the control logic and high voltage generator block 260. The row decoder 220 may operate responsive to the control of the control logic and high voltage generator block 260. The row decoder 220 may select word lines WL1 to WLm of the memory cell array 210. The row decoder 220 may select word lines WL1 to WLm of the memory cell array in response to an address ADDR transferred from the external. The row decoder 220 may receive selected voltages (e.g., high voltages) for a program operation from the control logic and high voltage generator block 260 to provide the received high voltages to selected and unselected word lines. In example embodiments, the address ADDR may be supplied from a controller 100 (e.g., FIG. 1).

The page buffer circuit 230 may store data to be programmed in the memory cell array 210 or data read out from the memory cell array 210. The page buffer circuit 230 may use the bit lines to program memory cells MC. In example embodiments, the page buffer circuit 230 may set a bit line connected to a memory cell to be programmed with a first reference voltage (e.g., ground voltage Vss) and a bit line connected with a memory cell to be program inhibited with a second reference voltage (e.g., power supply voltage Vcc).

The page buffer circuit 230 may receive control signals such as control signals Cveri_n from the control logic and high voltage generator block 260. The control signals Cveri_n may indicate whether one of a plurality of verify voltages is to be applied to corresponding memory cells. The page buffer circuit 230 may select ones of the memory cells to program fail in response to the control signals Cveri_n. Exemplary configurations and operations of page buffer circuits will be described herein (e.g., see FIGS. 9 and 10).

As shown in FIG. 2, the pass/fail check circuit 240 may be connected to the page buffer circuit 230 and the control logic and high voltage generator block 260. The pass/fail check circuit 240 may judge program pass or fail of memory cells MC. The judgment result of the pass/fail check circuit 240 may be transferred to the control logic and high voltage generator block 260 or the like.

As shown in FIG. 2, the data input/output circuit 250 may be connected to the page buffer circuit 230 and the control logic and high voltage generator block 260. The data input/output circuit 250 may operate responsive to the control of the control logic and high voltage generator block 260. The data input/output circuit 250 may be configured to exchange data with or between the page buffer circuit 230 and the external. In example embodiments, the data input/output circuit 250 may be configured to exchange data with a controller 100 (e.g., see FIG. 1). The data input/output circuit 250 may include constituent elements such as a column select gate, a data buffer, and the like that are well known in the art.

As shown in FIG. 2, the control logic and high voltage generator block 260 may be connected to the row decoder 220, the pass/fail check circuit 240, and the data input/output circuit 250. The control logic and high voltage generator block 260 may control overall operations of the flash memory device 200 and generate high voltages required at program/erase operations. The control logic and high voltage generator block 260 according to example embodiments may provide a set of verify voltages Vver (e.g., sequentially) to the memory cell array 210 via the row decoder 220 while memory cells are selectively programmed to have a prescribed logic state. The set of verify voltages Vver may be formed of two or more verify voltages according to example embodiments.

While memory cells are programmed to have one logic state, the set of verify voltages Vver may be produced in response to the control signals Cveri_n. In example embodiments, if the control signals Cver_n are formed of two signals Cveri_1 and Cveri_2, the control logic and high voltage generator block 260 may provide the memory cell array 210 with two, three or four different verify voltages Vver. Further, the control logic and high voltage generator block 260 may provide the control signals Cveri_n to the page buffer circuit 230.

The control logic and high voltage generator block 260 according to example embodiments may include a verify level control circuit 262 to control verify voltages used at a program operation. While memory cells are programmed to have one of a plurality of logic states, the verify level control circuit 262 may generate verify voltages Vver in response to control signals Cveri_n. The verify voltages Vver may include or consist of two or more verify voltages. The verify voltages Vver generated by the verify level control circuit 262 may be supplied in a prescribed order (e.g., in sequence) to the memory cell array 210 via the row decoder 220.

Figure 3:
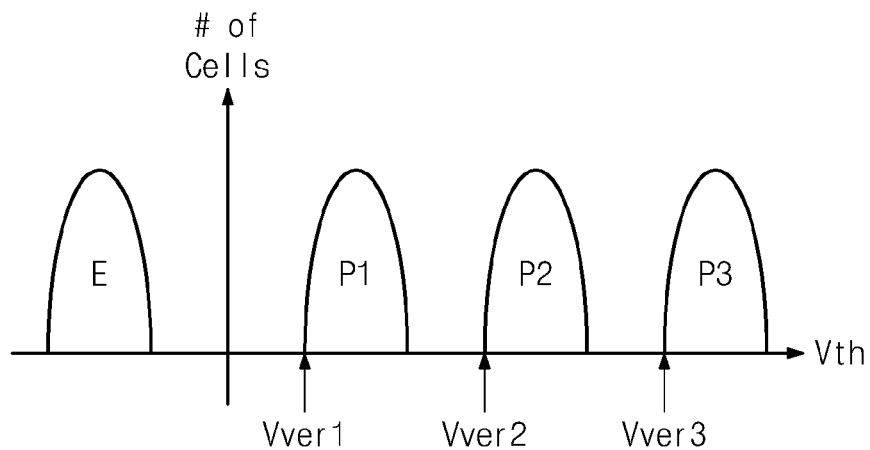
FIG. 3 is a diagram showing exemplary threshold voltage distributions of memory cells in FIG. 2.

FIG. 3 is a diagram showing exemplary threshold voltage distributions of memory cells in FIG. 2. In FIG. 3, the horizontal axis indicates a voltage, and a longitudinal axis indicates the number of memory cells.

Memory cells MC according to example embodiments may be programmed to have one of a plurality of logic states. FIG. 3 shows an example where memory cells MC are programmed to have one of four logic states. However, example embodiments are not intended to be limited to such disclosure.

As shown in FIG. 3, memory cells MC may be programmed to have one of four states E, P1, P2, and P3. The logic state E may indicate that memory cells MC are erased. Memory cells MC may be programmed using a verify voltage Vver1 to have the logic state P1. Memory cells MC may be programmed using a verify voltage Vver2 to have the logic state P2. Memory cells MC may be programmed using a verify voltage Vver3 to have the logic state P3.

Multi-level cells may be programmed in a sequential program manner. In example embodiments, the Least Significant Bit (LSB) data is programmed, and then the Most Significant Bit (MSB) data is programmed. However, example embodiments are not intended to be limited to such an exemplary disclosure. At a program operation for the LSB data, memory cells MC to be programmed to the logic states P1 and P2 may be programmed to the logic state P1, and memory cells MC to be programmed to the logic state P3 may be maintained at the logic state E. Further, memory cells MC to be maintained at the logic state E (e.g., memory cells MC to be program inhibited) may be maintained at the logic state E.

At a program operation for the MSB data, memory cells to be programmed to the logic state P2 may be programmed to the logic state P2 from the logic state P1. Memory cells to be programmed to the logic state P3 may be programmed to the logic state P3 from the logic state E. However, example embodiments are intended to include other programming sequences that result in the transition of memory cells MC from the erased state to threshold voltages representative of fully programmed MSB and LSB data.

Coupling may be induced between adjacent memory cells MC (e.g., F-poly coupling) when memory cells are programmed. For the following example, it is assumed that a memory cell MC2 is programmed to have a logic state P1 and memory cells MC1 and MC3 are programmed to have a logic state P3. When the LSB data is programmed, the memory cell MC2 is programmed to the logic state P1 and the memory cells MC1 and MC3 are maintained at the logic state E. When the MSB data is programmed, the memory cell MC2 is maintained at the logic state P1, while the memory cells MC1 and MC3 are programmed to the logic state P3.

While the memory cells MC1 and MC3 adjacent to the memory cell MC2 are programmed to the logic state P3, the memory cell MC2 may suffer the coupling influence from the memory cells MC1 and MC3. A threshold voltage corresponding to the logic state P3 is higher than that corresponding to the logic state P1. Thus, a threshold voltage of the memory cell MC2 may be increased because of corresponding coupling with the memory cells MC1 and MC3. For example, a threshold voltage distribution corresponding to the memory cell MC2 may be different from the threshold voltage distribution corresponding to the logic state P1 illustrated in FIG. 3. In example embodiments, a threshold voltage distribution corresponding to the memory cell MC2 may be formed at a higher voltage area than a threshold voltage distribution corresponding to the logic state P1 illustrated in FIG. 3.

As described herein, a threshold voltage distribution of memory cells may be changed (e.g., because of the coupling with adjacent memory cells) to reduce or decrease a read margin used to judge among a plurality of logic states (e.g., E, P1, P2, and P3). Example embodiments may provide a program operation of a memory device or a memory device that can prevent and/or compensate the reduced read margin among the programmed logic states. Example embodiments may provide a program operation of a memory device or a memory device that can reduce and/or compensate the coupling effect.

Figure 4:
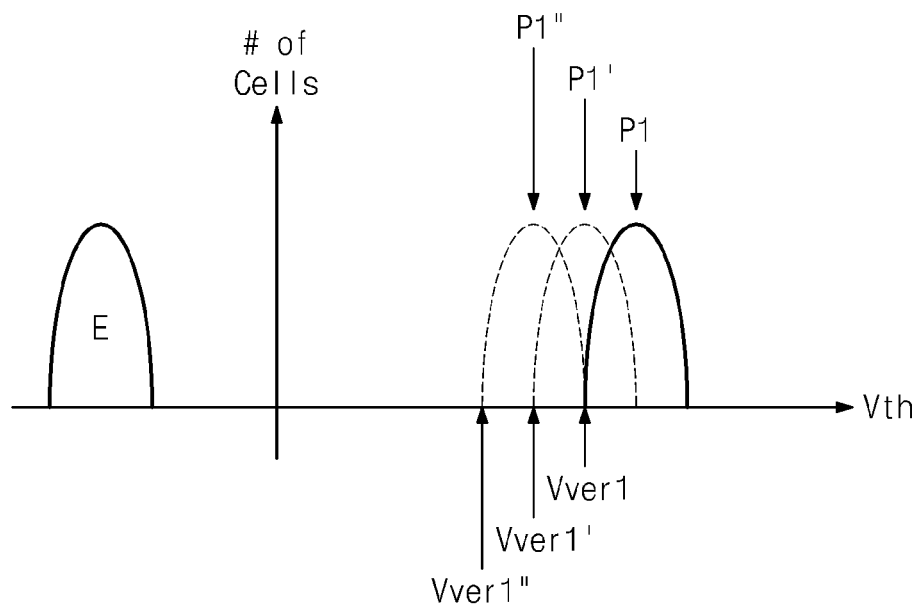
FIG. 4 is a diagram showing an exemplary threshold voltage distribution of programmed memory cells of a flash memory device in FIG. 2.

FIG. 4 is a diagram showing exemplary threshold voltage distribution of programmed memory cells of a flash memory device in FIG. 2. As shown in FIG. 4, a horizontal axis indicates a voltage, and a longitudinal axis indicates the number of memory cells in the threshold voltage distribution. In FIG. 4, exemplary threshold voltage distributions of programmed memory cells of a flash memory device having a logic state of "1" are shown.

Referring to FIGS. 2 and 4, a flash memory device 200 according to example embodiment may perform a program operation using a set of verify voltages when memory cells are programmed to have a single logic state (e.g., logic state P1). In example embodiments, the verify voltages may include two or more verify voltages (e.g., Vver1, Vver1', Vver1" of FIG. 4) when memory cells are programmed to have each of a plurality of logic states.

A threshold voltage distribution of memory cells programmed using a verify voltage Vver1 (e.g., a standard verify voltage) may have a shape marked by P1. A threshold voltage distribution of memory cells programmed using a verify voltage Vver1' may have a shape marked by P1'. A threshold voltage distribution of memory cells programmed using a verify voltage Vver1' may have a shape marked by P1'. Exemplary threshold voltage distributions are shown in FIG. 4.

For example, threshold voltage distributions of memory cells programmed using the verify voltage Vver1' and Vver1" may be formed at a lower area than a threshold voltage distribution of memory cells programmed using the standard verify voltage Vver1. Thus, although a threshold voltage of a memory cell MC2 is increased because of the coupling with adjacent memory cells MC1 and MC3, a threshold voltage distribution corresponding to the memory cell MC2 may be formed at or substantially at a voltage area of the logic state P1. For example, the flash memory device according to example embodiments may consider or predict the coupling effect from adjacent memory cells and then program memory cells using one of a plurality of verify voltages (e.g., Vver1, Vver1', and Vver1") in consideration or the predicted coupling effect of adjacent memory cells. According to example embodiments, it is possible to prevent and/or compensate the reduced read margin and/or coupling effect by use of a program operation in consideration of the coupling effect.

The coupling effect of the memory cell MC2 caused by adjacent memory cells MC1 and MC3 may be different based upon at least a logic state to be programmed of the memory cell MC2 and logic states to be programmed of the memory cells MC1 or MC3. For example, the coupling effect caused when the memory cells MC1 and MC3 are programmed to the logic state P3 may be more than the coupling affect caused when the memory cells MC1 and MC3 are programmed to the logic state P2. Accordingly, the flash memory device 200 of example embodiments may determine a verify voltage of the memory cell MC2 based upon logic states to be programmed of the memory cells MC1, MC2, MC3.

In a case where no coupling effect is transferred from the adjacent memory cells MC1 and MC3, the memory cell MC2 may be programmed using the verify voltage Vver1. For example, if a logic state to be programmed to the adjacent memory cells MC1 and MC3 is lower than a logic state to be programmed to the memory cell MC2, the coupling effect transferred from the adjacent memory cells MC1 and MC3 to the memory cell MC2 may be insignificant or ignored. At this time, the memory cell MC2 may be programmed using the verify voltage Vver1.

If the coupling effect induced by the adjacent memory cells MC1 and MC3 is relatively little, the memory cell MC2 may be programmed using the verify voltage Vver1'. For example, the adjacent memory cells MC1 and MC3 are programmed to the logic state P2, the memory cell MC2 may be programmed using the verify voltage Vver1'.

If the coupling affect induced by the adjacent memory cells MC1 and MC3 is relatively large, the memory cell MC2 may be programmed using the verify voltage Vver1". For example, the adjacent memory cells MC1 and MC3 are programmed to the logic state P3, the memory cell MC2 may be programmed using the verify voltage Vver1".

As described herein, in an exemplary case where the memory cell MC2 is programmed to the logic state P1, the verify voltages Vver1, Vver1', and Vver1" of the memory cell MC2 may be determined in consideration of the coupling effects caused by the adjacent memory cells MC1 and MC3.

If the adjacent memory cells MC1 and MC3 are programmed to have one of the logic states P2 and P3 after the memory cell MC2 is programmed, a threshold voltage distribution corresponding to the memory cell MC2 may be shifted from P1" to P1 or P1' to P1 because of programming the adjacent memory cells MC1 and MC3. Thus, example embodiments can prevent and/or compensate the coupling effect forced to the memory cell MC2 from the adjacent memory cells MC1 and MC3.

Figures 5, 6:
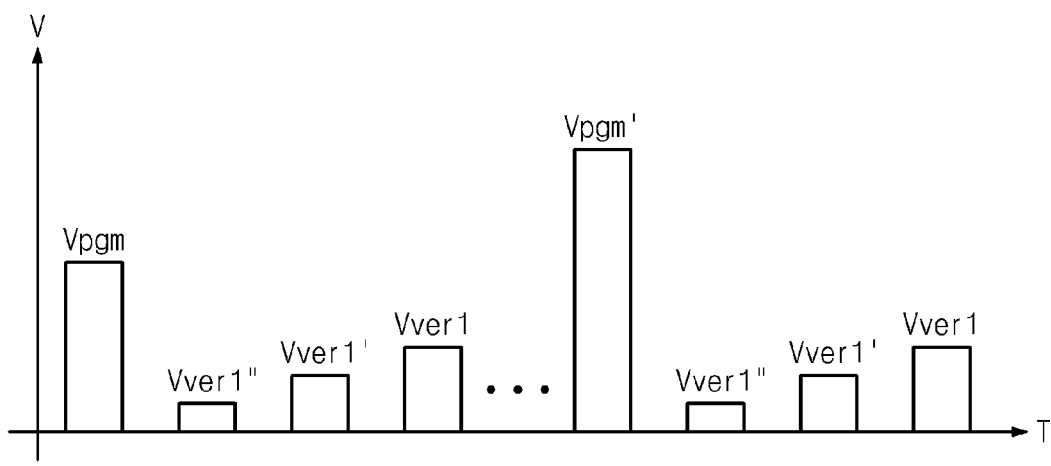
FIG. 5 is a diagram showing exemplary bias conditions of a verify voltage determined according to coupling influence.
FIG. 6 is a diagram for describing an exemplary method of applying program and verify voltages in accordance with a flash memory device in FIG. 2 according to example embodiments.

FIG. 5 is a diagram showing exemplary bias conditions of a verify voltage according to example embodiments. In FIG. 5, it is assumed that a memory cell MC2 is a memory cell to be programmed and memory cells MC1 and MC3 are placed to be adjacent (e.g., immediately adjacent on opposite sides of the memory cells M2) to the memory cells MC2. A verify level control circuit 262 may generate verify voltages Vver1, Vver1', Vver1", Vver2, Vver2', and Vver3 used to program the memory cell MC2. The verify voltages Vver1, Vver1', Vver1", Vver2, Vver2', and Vver3 are sequentially provided to a memory cell array (e.g., the memory cell array 210).

Referring to FIGS. 2 and 5, when the memory cell MC2 is programmed to have a logic state P1, it may be programmed using one of the verify voltages Vver1, Vver1', and Vver1".

When the adjacent memory cells MC1 and MC3 are programmed to have a logic state P1 or are maintained at an erase state E, no coupling or very little coupling will be is caused by programming the adjacent memory cells MC1 and MC3. Thus, the memory cell MC2 may be programmed using a standard verify voltage Vver1.

For example, when the coupling effect from the adjacent memory cells MC1 and MC3 is relatively large, the memory cell MC2 may be programmed using the verify voltage Vver1". As shown in FIG. 5, when the adjacent memory cells MC1 and MC3 are programmed to have a logic state P3 or to have logic states P2 and P3, respectively, the memory cell MC2 may be programmed using the verify voltage Vver1". In example embodiments, the verify voltage Vver1" may be lower than the verify voltage Vver1. In example embodiments, a voltage difference between the verify voltages Vver1 and Vver1" may be about 300 mV.

For example, when the coupling effect from the adjacent memory cells MC1 and MC3 is relatively little, the memory cell MC2 may be programmed using the verify voltage Vver1'. In example embodiments, the verify voltage Vver1' may be lower than the verify voltage Vver1. In example embodiments, a voltage difference between the verify voltages Vver1 and Vver1' may be about 200 mV.

Referring to FIGS. 2 and 5, in a case where the memory cell MC2 is programmed to have a logic state P2, it may be programmed using one of the verify voltages Vver2 and Vver2'. When coupling is not caused by the adjacent memory cells MC1 and MC3, for example when the adjacent memory cells MC1 and MC3 are programmed to have logic states E, P1 and P2 equal to or lower than the logic state P2, the memory cell MC2 may be programmed using the standard verify voltage Vver2. As shown in FIG. 5, when the coupling is caused by the memory cells M1 and M3 adjacent to memory cells MC2, the memory cell MC2 may be programmed by using the verify voltage Vver2'. In example embodiments, the verify voltage Vver2' may be lower than the verify voltage Vver2. In example embodiments, a voltage difference between the verify voltages Vver2 and Vver2' may be about 100 mV.

For example, when the memory cell MC2 is programmed to have the logic state P2, it may suffer the coupling when just one of the adjacent memory cells MC1 and MC3 is programmed to have the logic state P3. Alternatively, when the memory cell MC2 is programmed to have the logic state P2, it may suffer the coupling when both of the adjacent memory cells MC1 and MC3 are programmed to have the logic state P3.

For example, the coupling caused by the adjacent memory cells MC1 and MC3 when the memory cell MC2 is programmed to have the logic state P1 may be shown to be different or vary from the effects the memory cell MC2 is programmed to have the logic state P2. Thus, a first plurality of verify voltages (e.g., Vver1, Vver1', and Vver1") used when the memory cell MC2 is programmed to have a first logic state (e.g., P1) may be different (e.g., increased granularity, increased subdivisions, increased/decreased voltage differentials) relative to a second plurality of verify voltages (e.g., Vver2 and Vver2') used when the memory cell MC2 is programmed to have a second logic state (e.g., P2). For example, the verify voltages Vver1, Vver1', and Vver1" used when the memory cell MC2 is programmed to have the logic state P1 may be further subdivided as compared with the verify voltages Vver2 and Vver2' used when the memory cell MC2 is programmed to have the logic state P2.

Further, exemplary voltage differences (e.g., 100 mV, 200 mV, etc.) have been described. However, example embodiments are not intended to be limited by such an exemplary disclosure. For example, verify voltages may differ by amounts that could be larger or smaller.

The logic state P3 is a logic state that is formed at the highest voltage area and may be programmed last at a program operation. For at least this reason, when the memory cell MC2 is programmed to have the logic state P3, it may not suffer the coupling from the adjacent memory cells MC1 and MC3. Thus, the memory cell MC2 may be programmed to have the logic state P3 using a single verify voltage Vver3.

When the memory cell MC2 is programmed to have the logic state P1, the verify voltages Vver1, Vver1', and Vver1" may be supplied sequentially to a memory cell array 210. In example embodiments, the verify voltages Vver1, Vver1', and Vver1" may be supplied sequentially to the memory cell array 210 in an ascending order.

As shown in FIG. 5, three verify voltages Vver1, Vver1', and Vver1" are used when the memory cell MC2 is programmed to have the logic state P1, two verify voltage Vver2 and Vver2' are used when it is programmed to have the logic state P2, and one verify voltage Vver3 is used when it is programmed to have the logic state P3. However, a number of verify voltages used to program the memory cell MC2 to each logic state according to example embodiments are not intended to be limited by such an exemplary disclosure. For example, the number of verify voltages may be increased by subdividing the coupling from the nearby or adjacent memory cells, while the number of verify voltages may be decreased by simplifying the coupling from the nearby or adjacent memory cells MC1 and MC3.

FIG. 5 shows that the memory cell MC2 has one of four logic states E, P1, P2, and P3. However, a number of logic states used by the memory cell MC2 according to example embodiments is not intended to be limited by such exemplary disclosure. For example, the number of logic states at the memory cells of the memory cell array 210 may be decreased or increased. Further, in a case where the memory cell MC2 has one of a plurality of logic states, a set of verify voltages may be used to program the memory cell MC2 to have at least one of the plurality of logic states.

FIG. 6 is a diagram for describing an exemplary method of applying program and verify voltages in accordance example embodiments that can be applied to and described using the flash memory device in FIG. 2, however, the method is not intended to be so limited. As show in FIG. 6, a horizontal axis indicates a time, and a longitude axis indicates a voltage. In some exemplary embodiments, it is assumed that a memory cell MC2 is programmed to have a logic state P1. Referring to FIGS. 2, 4, and 6, a program voltage Vpgm is applied to a memory cell array 210. In the exemplary method, the program voltage Vpgm may be supplied to a word line WL1. At this time, memory cells MC1 to MC3 may be programmed. Afterwards, verify voltages Vver1", Vver1', and Vver1 may be supplied sequentially to the memory cell array 210. At this time, the verify voltages Vver1", Vver1', and Vver1 may be supplied to the word line WL1. Such program and verify operations may be conducted repeatedly with the program voltage Vpgm being increased.

A threshold voltage of each of memory cells (e.g., in memory array 210) to be programmed to a logic state P1" may be increased by the program voltage Vpgm. If threshold voltages of memory cells to be programmed to a logic state P1" are higher than a verify voltage Vver1", the memory cells may be judged to be program passed, and then they may be set to program-inhibited memory cells. Thus, memory cells P1" may be programmed to have the logic state P1".

Threshold voltages of memory cells to be programmed to a logic state P1' (e.g., in memory array 210) may be increased by the program voltage Vpgm and may be judged as program pass using a verify voltage Vver1'. However, since verify voltages Vver1", Vver1', and Vver1 are sequentially supplied, memory cells to be programmed to the logic state P1' may be judged as program pass by both the verify voltage Vver1' and the verify voltage Vver1". When the memory cells to be programmed to the logic state P1' are judged as program pass by the verify voltage Vver1", the memory cells to be programmed to the logic state P1' may be programmed (e.g., improperly) to the logic state P1".

Likewise, when memory cells to be programmed to a logic state P1 are judged as program pass by the verify voltage Vver1" or the verify voltage Vver1', respectively, the memory cells to be programmed to a logic state P1 may be programmed (e.g., improperly) to the logic state P1" or the logic state P1'.

In order to program memory cells to the intended logic state (e.g., P1, P1', P1", etc.), a memory device according to example embodiments may selectively program fails states. For example, a page buffer circuit 230 according to example embodiments may be configured to set memory cells to program fail states when a set of verify voltages for a logic state are used. For example, in the above example where the verify voltage Vver1" is applied, the page buffer circuit 230 may set memory cells to be programmed to logic states P1' and P1 to program fail states. Likewise, when the verify voltage Vver1' is applied, the page buffer circuit 230 may set memory cells to be programmed to the logic state P1 to program fail states. The page buffer circuit 230 will be described in greater detail herein (e.g., with reference to FIGS. 9 and 10.

Figure 7:
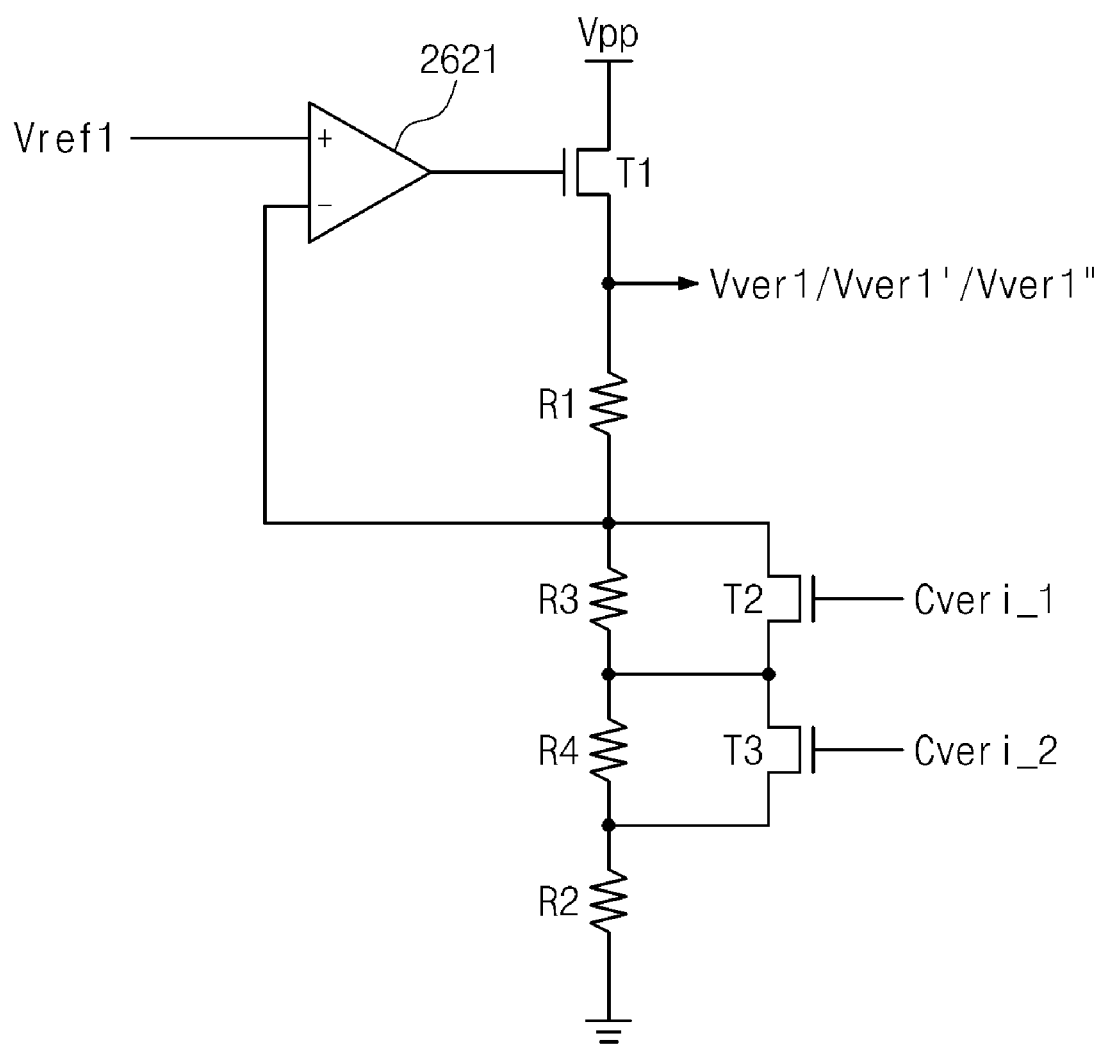
FIG. 7 is a circuit diagram showing an exemplary verify level control circuit in FIG. 2.

FIG. 7 is a circuit diagram showing an exemplary verify level control circuit that may be used for the verify level control circuit 262 in FIG. 2. Referring to FIGS. 2 and 7, a verify level control circuit 262' may include a differential amplifier 2621, resistors R1 to R4, and transistors T1 to T3.

A reference voltage Vref is supplied to a non-inverting input of the differential amplifier 2621, and an inverting input of the differential amplifier 2621 is connected between the resistors R1 and R3. An output of the differential amplifier 2621 is connected to a gate of the transistor T1. The transistor T1 selectively transfers a high voltage Vpp into the resistor R1 in response to an output of the differential amplifier 2621. In example embodiments, the differential amplifier 2621 and the transistor T1 may constitute a voltage driving part to provide a high voltage in response to the reference voltage Vref.

The resistors R1 to R4 may connect in series. The transistors T2 and T3 may connect in parallel with the resistors R3 and R4, respectively. The transistors T2 and T3 operate responsive to control signals Cveri_1 and Cveri_2. The transistors T2 and T3 and the resistors R1 to R4 may constitute a voltage dividing part to divide the high voltage Vpp provided via the transistor T1. A voltage between the resistors R1 and R3 may be output as a plurality of verify voltages (e.g., a verify voltage Vver1, Vver1', or Vver1"). A voltage division rate of the voltage dividing part may be varied according to the control signals Cveri_1 and Cveri_2. For example, a verify voltage being an output of the verify level control circuit 262' may be varied by the control signals Cveri_1 and Cveri_2.

In one embodiment, if the control signals Cveri_1 and Cveri_2 are at a logic high level, the verify level control circuit 262' may output a verify voltage, having a relatively low voltage level, among the verify voltages Vver1, Vver1', and Vver1". If the control signals Cveri_1 and Cveri_2 are at a logic low level, the verify level control circuit 262' may output a verify voltage, having a relatively high voltage level, among the verify voltages Vver1, Vver1', and Vver1".

Thus, the verify level control circuit 262' may output one of the verify voltages Vver1, Vver1', and Vver1" in response to the control signals Cveri_1 and Cveri_2. Although not shown in figures, the verify level control circuit 262' according to example embodiments may further comprise a circuit to generate verify voltages Vver2 and Vver2', which may be configured using the structure as illustrated in FIG. 7.

The verify level control circuit 262 according to example embodiments may selectively generate the verify voltages Vver1, Vver1', and Vver1" sequentially in response to the control signals Cveri_n while a memory cell is programmed to have one of a plurality of logic states. In some embodiments, the verify voltage Vver1" is output when the control signals Cveri_1 and Cveri_2 are at a logic low level. The verify voltage Vver1' is output when the control signal Cveri_1 is at a logic high level and the control signal Cveri_2 is at a logic low level. A verify voltage Vver1 (e.g., a standard verify voltage) is output when the control signal Cveri_1 is at a logic low level and the control signal Cveri_2 is at a logic high level.

A verify voltage required at a flash memory device 200 may be changed according to example embodiments. A verify voltage required at a flash memory device 200 may be changed, for example, because of a process error. The flash memory device 200 according to example embodiments may further comprise a verify level trim circuit to adjust a verify voltage to a voltage level required by the flash memory device 200.

Figure 8:
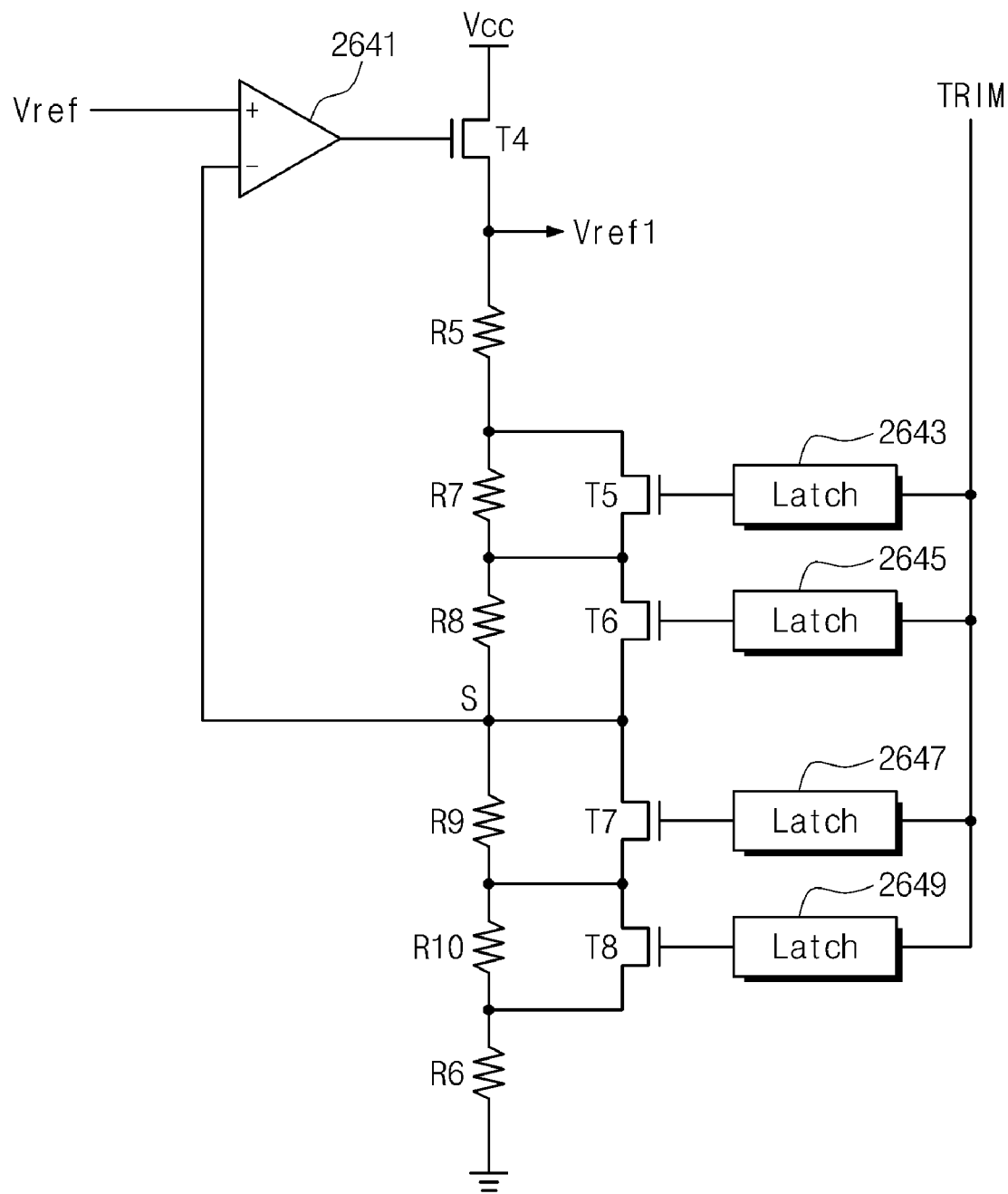
FIG. 8 is a circuit diagram showing a verify level trim circuit according to according to example embodiments.

FIG. 8 is a circuit diagram showing an exemplary verify level trim circuit according to example embodiments. In one embodiment, a verify level trim circuit 264 may be included in a control logic and high voltage generator block 260. Referring to FIGS. 2, 7, and 8, the verify level trim circuit 264 may include a differential amplifier 2641, resistors R5 to R10, transistors T4 to T8, and latches 2643, 2645, 2647, and 2649.

A reference voltage Vref is transferred to a non-inverting input of the differential amplifier 2641, and an inverting input of the differential amplifier 2641 is connected with an interconnection node of the resistors R8 and R9. An output of the differential amplifier 2641 is transferred to a gate of the transistor T4 to transfer a power supply voltage Vcc to the resistor R5 in response to an output of the differential amplifier 2641. The resistors R5 to R10 are connected in series. The transistors T5 to T8 are connected in parallel with the resistors R7 to R10, respectively. Gates of the transistors T5 to T8 are connected with corresponding latches 2643 to 2649, respectively. A voltage between the transistor T4 and the resistor R5 is output as a reference voltage Vref1, which may be supplied to a verify level control circuit 262.

The resistors R7 and R8, the transistors T5 and T6, and the latches 2643 and 2645 may constitute an up-trim part, and the resistors R9 and R10, the transistors T7 and T8, and the latches 2647 and 2649 may constitute a down-trim part. A voltage of the node S is a voltage obtained by dividing a power supply voltage Vcc via the up-trim and down-trim parts. The differential amplifier 2641 controls the transistor T4 to supply a power supply voltage Vcc to the up-trim and down-trim parts, such that the reference voltage Vref becomes identical with a voltage of the node S.

The transistors T5 and T6 are turned on when a logic high level is stored in the latches 2643 and 2645. The enabled transistors T5 and T6 can decrease a resistance of the up-trim part and increase a voltage of the node S. At this time, since the differential amplifier 2641 outputs a negative voltage, the transistor T4 is turned off and the reference voltage Vref1 is lowered. If a logic high level is stored in the latches 2647 and 2648, the transistors T7 and T8 are turned on to lower a voltage of the node S because a resistance of the down-trim part is decreased. At this time, since the differential amplifier 2641 outputs a positive voltage, the transistor T4 is turned on, and the reference voltage Vref1 is increased.

It is possible to adjust the reference voltage Vref1 provided to the verify level control circuit 262 by adjusting data (e.g., trim data TRIM) stored in the latches 2643 to 2649. Thus, the verify voltage may be adjusted to a voltage required by the flash memory device 200. However, the example embodiments are not intended to be limited by such disclosure of an exemplary verify level trim circuit. Alternative circuits or components that function to maintain the reference voltage to a selected level may be used.

Data TRIM may be stored in the latches 2643 to 2649 and may be stored as non-volatile data. In some embodiments, the data TRIM is read out at power-on to be stored in the latches 2643 to 2649. The data TRIM may be stored in the memory cell array 210.

As shown in FIG. 8, the verify level trim circuit 264 may use electrical fuses, which are formed of the latches 2643 to 2649 and the transistors T5 to T8. However, the verify level trim circuit 264 according to example embodiments is not intended to be limited to this disclosure. In example embodiments, the verify level trim circuit 264 may use different electrical fuses from the example shown in FIG. 8. For example, the verify level trim circuit 264 may use a different circuit or be formed of different fuses such as laser fuses or the like.

Figure 9:
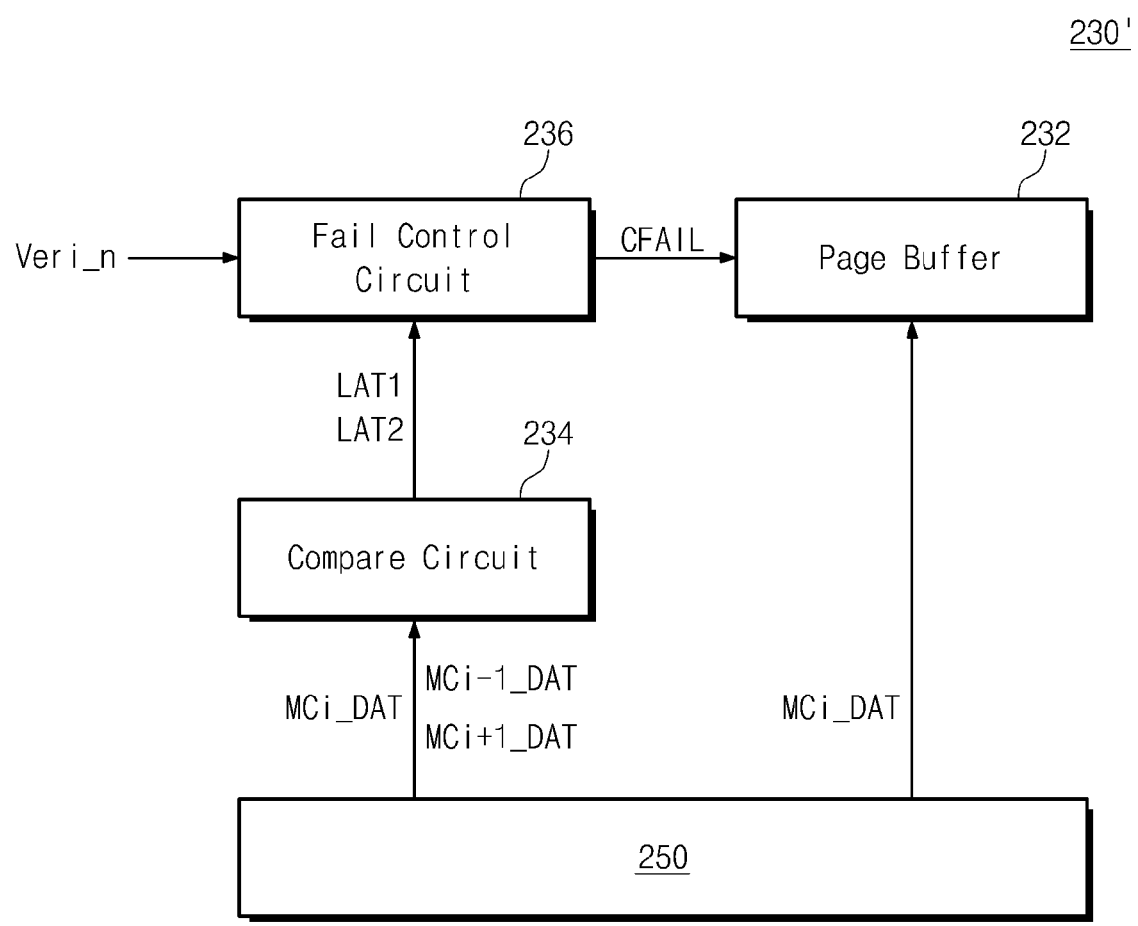
FIG. 9 is a block diagram showing an exemplary page buffer circuit in FIG. 2.

FIG. 9 is a block diagram showing an exemplary page buffer circuit according to example embodiments. In some embodiments, the exemplary page buffer shown in FIG. 9 may be used for the page buffer 230 shown in FIG. 2. However, example embodiments are not intended to be so limited. Referring to FIGS. 2, 4, 5, and 9, a page buffer circuit 230' may include a compare circuit 234, a fail control circuit 236, and a page buffer 232.

The compare circuit 234 may connect with an input/output circuit 250 and the fail control circuit 236. The compare circuit 234 may receive data MCi_DAT of a memory cell MCi and data MCi−1_DAT and MCi+1_DAT of memory cells MCi−1 and MCi+1 adjacent to the memory cell MCi from the input/output circuit 250. The compare circuit 234 can compare the received data MCi_DAT, MCi−1_DAT, and MCi+1_DAT to generate latch signals LAT1 and LAT2.

In some embodiments, in the case that the memory cell MCi is programmed using a verify voltage Vver1", the compare circuit 234 sets the latch signals LAT1 and LAT2 to a logic low level. In the case that the memory cell MCi is programmed using a verify voltage Vver1', the compare circuit 234 sets the latch signal LAT1 to a logic high level and the latch signal LAT2 to a logic low level. If the memory cell MCi is programmed using a verify voltage Vver1, the compare circuit 234 sets the latch signal LAT1 to a logic low level and the latch signal LAT2 to a logic high level. The latch signals LAT1 and LAT2 are transferred to the fail control circuit 236.

The fail control circuit 236 may connect to the compare circuit 234 and the page buffer 232. The fail control circuit 236 may receive the latch signals LAT1 and LAT2 from the compare circuit 234 and control signals Cveri_n from a control logic and high voltage generator block 260. The fail control circuit 236 may generate a fail signal CFAIL in response to the control signals Cveri_n and the latch signals LAT1 and LAT2. The fail signal CFAIL is sent to the page buffer 232.

The page buffer 232 may connect to the fail control circuit 236 and the data input/output circuit 250. The page buffer 232 may receive data MCi_DAT to be programmed in the memory cell MCi from the data input/output circuit 250. The page buffer 232 receives the fail signal CFAIL from the fail control circuit 236. When the fail signal CFAIL is activated, the page buffer 232 may set the memory cell MCi to a program fail state. To set the memory cell MCi to a program fail state, for example, the fail signal CFAIL is provided to a gate of a transistor connected between a sensing node of the page buffer 232 and a ground voltage.

When the fail signal CFAIL is activated, the sensing node of the page buffer 232 is connected with a ground voltage (eg., a reference voltage). In this way, a voltage of the sensing node is lowered to a ground voltage and the memory cell MCi is set to a program fail state.

Figure 10:
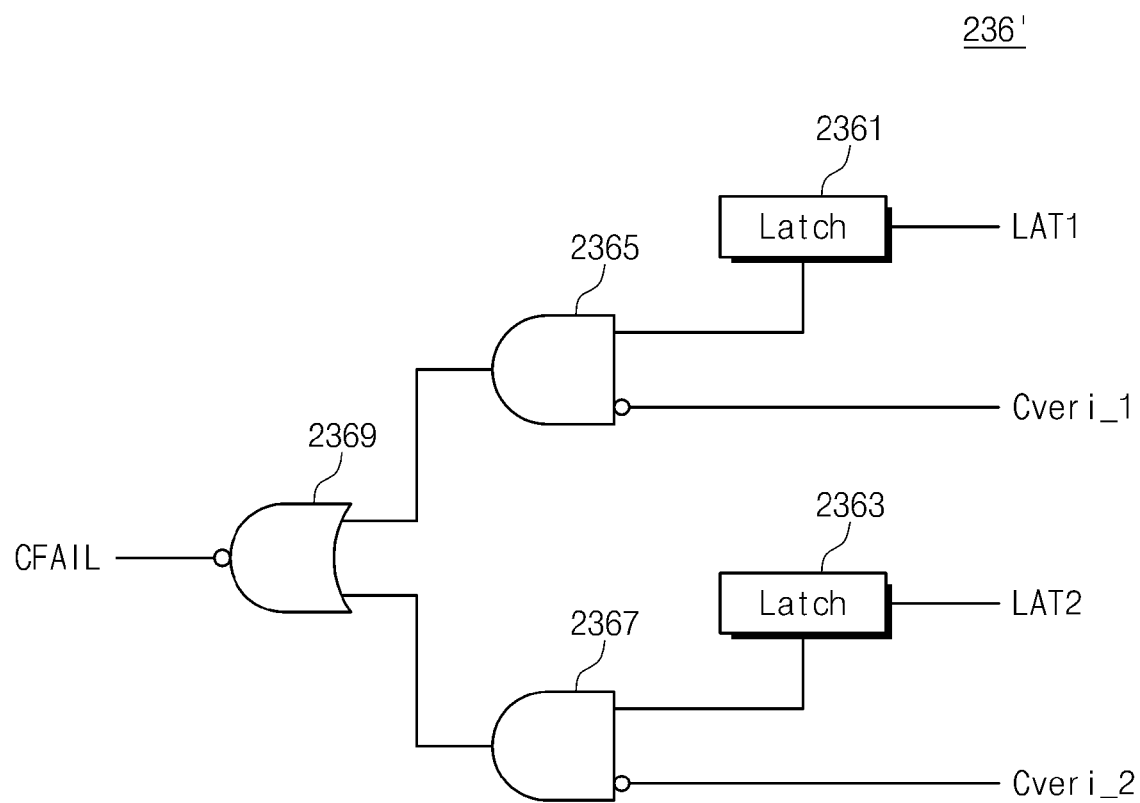
FIG. 10 is a block diagram showing an exemplary fail controlling circuit in FIG. 9.

FIG. 10 is a block diagram showing an exemplary fail controlling circuit according to example embodiments. The exemplary fail controlling circuit 236' in FIG. 10 may be used for the fail controlling circuit 236 in FIG. 9. Referring to FIGS. 2, 4, 5, 9, and 10, the fail control circuit 236' may include latches 2361 and 2363, AND gates 2365 and 2367, and a NOR gate 2369.

The latches 2361 and 2363 receive latch signals LAT1 and LAT2 from a compare circuit 234 in FIG. 9 (or, from a page buffer circuit 230 or the like), respectively. The AND gate 2365 is connected with the latch 2361 and an inverted version of a control signal Cveri_1. The AND gate 2367 is connected with the latch 2363 and an inverted version of a control signal Cveri_2. The NOR gate 2369 receives outputs of the AND gates 2365 and 2367 to output a fail signal CFAIL.

In some embodiments, (e.g., see FIG. 9) when a memory cell MCi is programmed to have a logic state P1", the latch signals LAT1 and LAT2 may have a logic low level, respectively. Accordingly, a logic low level is stored in the latches 2361 and 2363. The AND gates 2365 and 2367 output a low-level signal, and the fail signal CFAIL has a logic low level. For example, when the memory cell MCi is programmed to have a logic state P1", no fail signal CFAIL is generated. Accordingly, the memory cell MCi may be judged as program pass by use of a verify voltage Vver1" having the lowest voltage level. Thus, the memory cell MCi is programmed to the logic state P1".

In a case where the memory cell MCi is programmed to have a logic state P1', the latch signal LAT1 may go to a low level, and the latch signal LAT2 may go to a high level. Accordingly, the latch 2361 stores a logic high level, and the latch 2363 stores a logic low level. When a verify voltage Vver1" is applied to a memory cell array 210, the control signals Cveri_1 and Cveri_2 become high. At this time, since the AND gate 2365 outputs a high-level signal, the fail signal CFAIL is activated. Thus, in a case where a verify voltage Vver1" is applied to the memory cell array 210, the memory cell MCi to be programmed to a logic state P1' is set to a program fail state.

When a verify voltage Vver1' is applied to the memory cell array 210, the control signal Cveri_1 goes to a high level, and the control signal Cveri_2 goes to a low level. At this time, since the AND gates 2365 and 2367 output a low-level signal, the fail signal CFAIL is not activated. Thus, the memory cell MCi may be programmed to have a logic state P1'.

In a case where the memory cell MCi is programmed to have a logic state P1, the latch signal LAT1 may have a low level, and the latch signal LAT2 may have a high level. Accordingly, a low level is stored in the latch 2361, and a high level is stored in the latch 2363. When a verify voltage Vver1" is applied to the memory cell array 210, the control signals Cveri_1 and Cveri_2 go to a low level. At this time, since the AND gate 2367 outputs a high-level signal, the fail signal CFAIL is activated. Thus, when the verify voltage Vver1" is applied to the memory cell array 210, a memory cell MCi to be programmed to a logic state P1 is set to a program fail state.

In the event that a verify voltage Vver1' is applied to the memory cell array 210, the control signal Cveri_1 becomes high, and the control signal Cveri_2 becomes low. Since a logic high level is stored in the latch 2363, the AND gate 2367 outputs a high-level signal. At this time, the fail signal CFAIL is activated. Thus, when the verify voltage Vver1' is applied to the memory cell array 210, the memory cell MCi to be programmed to the logic state P1 is set to a program fail state.

In a case where a verify voltage Vver1 is applied to the memory cell array 210, the control signal Cveri_1 has a low level and the control signal Cveri_2 has a high level. At this time, since the AND gates 2365 and 2367 output a low-level signal, the fail signal CFAIL is not activated. Thus, since the memory cell MCi is judged as a program pass state via the verify voltage Vver1, it is programmed to the logic state P1.

Figure 11:
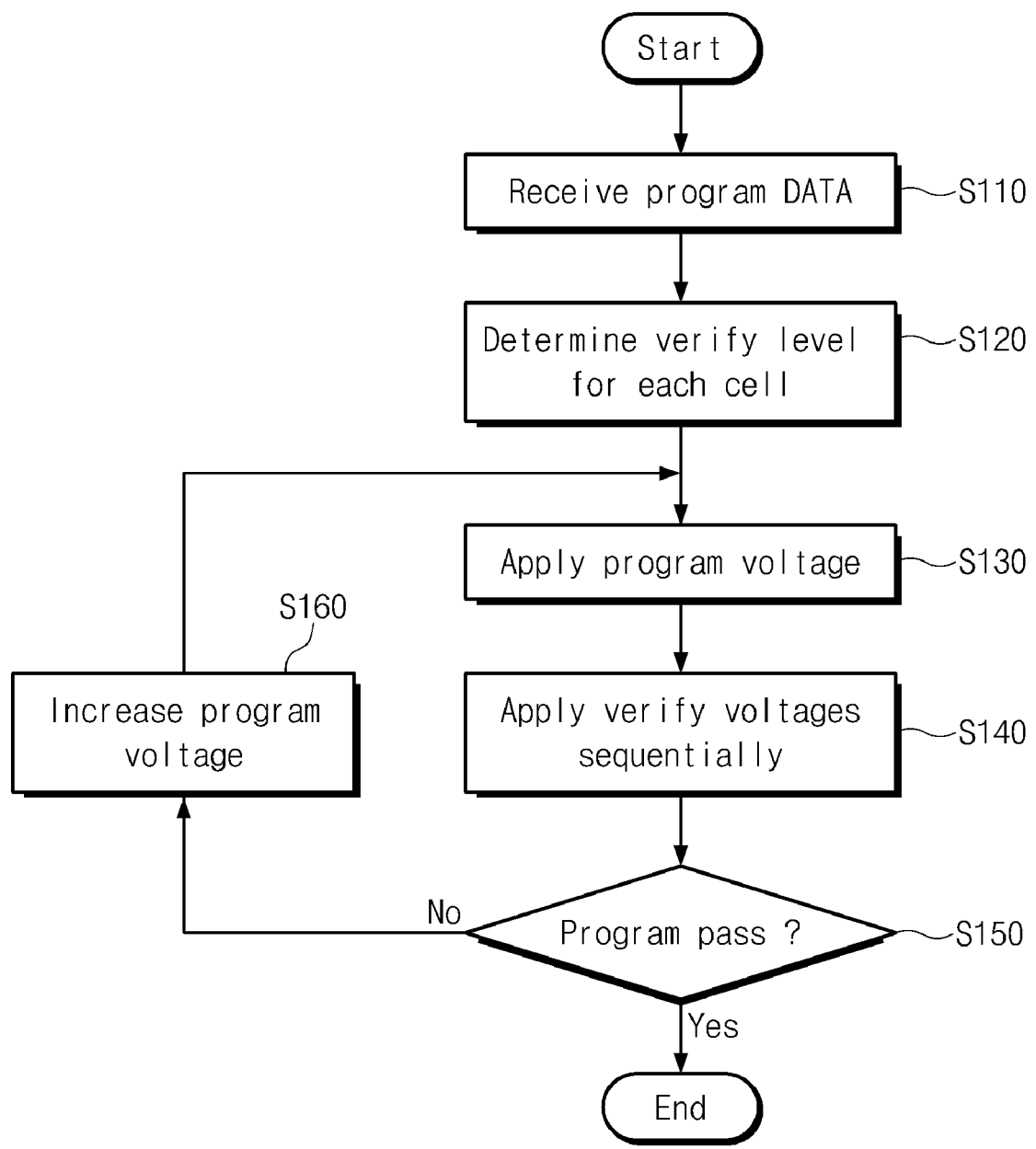
FIG. 11 is a flow chart for describing a program method of a flash memory device in FIG. 2 according to example embodiments.

FIG. 11 is a flow chart for describing an exemplary program method of a flash memory device according to example embodiments. The program method shown in FIG. 11 will be described using and may be applied to the flash memory device in FIG. 2, however, the program method of FIG. 11 is not intended to be limited thereby.

As shown in FIG. 11, after a process starts, in operation S110, program data for a memory array (e.g., a plurality of cells, wordline or the like) may be received. For example, a flash memory device 200 may receive program data to send to a page buffer circuit 230 via a data input/output circuit 250.

In operation S120, verify voltages of respective memory cells may be determined from the program data. Preferably for at least one logic state to be stored in the memory cells, the single programmed logic state may use a plurality of verify voltages. For example, the page buffer circuit 230 may determine the verify voltages by comparing logic states to be stored in a memory cell MCi and memory cells MCi−1 and MCi+1 adjacent to the memory cell MCi. In some embodiments, the memory cell MCi may be set to a program fail state via a page buffer 232 with respect to a verify voltage having a lower voltage level than a verify voltage of the memory cell MCi.

In operation S130, the memory cells may be programmed. For example, a program voltage is supplied to the memory cell array 210. In operation S140, verify voltages are supplied (e.g., sequentially) to the memory cell array 210. The verify voltages include a first plurality of verify voltages that correspond to a single logic state to be programmed. In some embodiments, operations S130 and S140 may be conducted as described in FIG. 6. At this time, the verify voltages may be applied to the memory cell array 210 in an ascending order as described in FIG. 6.

In operation S150, pass/fail program status may be determined. For example, a pass/fail check circuit 240 may judge whether a prescribed subset of or all memory cells have a program pass state. When the determination in operation S150 is affirmative, the program operation may end. Otherwise, from operation S150, the procedure goes to operation S160 where a program voltage may increase by a prescribed increment. From operation S160, the procedure may jump to operation S130.

As described herein, the flash memory device 200 according to example embodiments may conduct a verify operation using a set of verify voltages while a memory cell is programmed to a logic state or one of a plurality of logic states. Verify operations using the set of verify voltages may be conducted (e.g., sequentially) after a program operation. The set of verify voltages may be determined based upon logic states of a memory cell MCi and nearby memory cells (e.g., memory cells MCi−1 and MCi+1 adjacent to the memory cell MCi). Example embodiments may prevent or reduce the coupling caused by nearby or adjacent memory cells by performing a verify operation using a set of verify voltages when a memory cell is programmed to a logic state.

Figure 12:
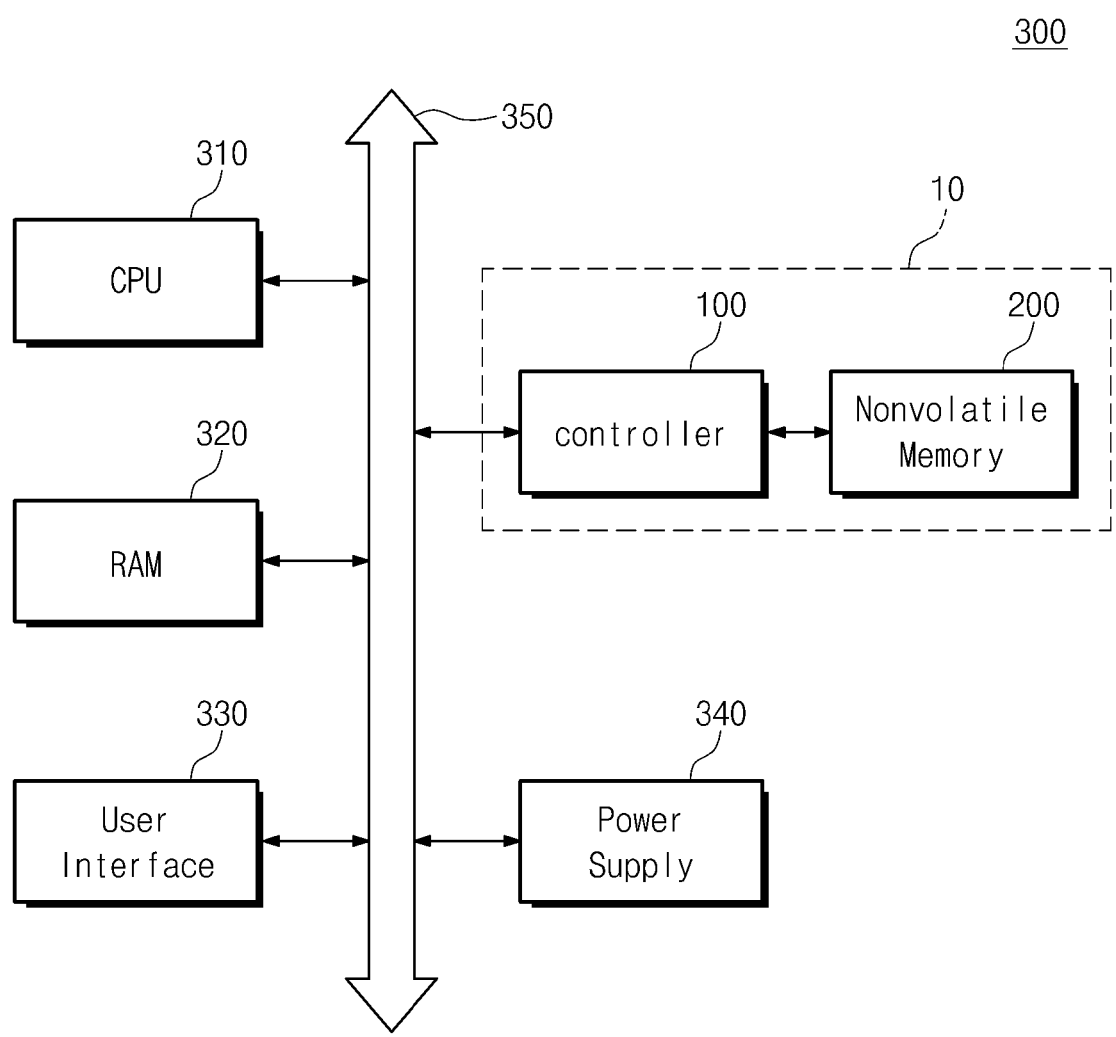
FIG. 12 is a block diagram showing an exemplary computing system including a memory system in FIG. 1.

FIG. 12 is a block diagram showing a computing system according to example embodiments including a memory system in FIG. 1. As shown in FIG. 12, a computing system 300 according to example embodiments may include CPU 310, RAM 320, a user interface 330, a power supply 330 and a memory system 10.

The memory system 10 is electrically connected to the elements 310 to 340 via a system bus 360. Data provided via the user interface 330 or processed by the CPU 310 may be stored in the memory system 10. The memory system 10 may include a controller 100 and a flash memory device 200.

In the event that the flash memory device 200 is mounted as Solid State Disk (SSD), a booting speed of the computing system 300 may increase. Further, the computing system 300 shown in FIG. 12, it is obvious to one skilled in the art that the computing system according to the example embodiments may be applied to or further comprise an Application Chipset (not shown), a Camera Image Processor (not shown) or the like.

The components shown in FIG. 12 are described as a computing system. However, according to example embodiments the components shown in FIG. 12 may be considered or be interpreted as a memory system (e.g., to include the flash memory device 200).

Memory cells may be programmed using one or more verify voltages in order to prevent and/or compensate the coupling caused due to adjacent memory cells and/or later programmed memory cells. In some embodiments, a compensated verify voltage may be determined using source data before programming. Thus, it is possible to prevent and/or compensate variations of threshold voltages of memory cells due to the coupling from adjacent memory cells to a memory cell to be programmed. Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of threshold voltage distributions or voltage levels illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to "one embodiment," "an embodiment," "example embodiment," some embodiments, etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc. In addition, exemplary diagrams illustrate various methods in accordance with embodiments of the present disclosure. Such exemplary method embodiments are described herein using and can be applied to corresponding apparatus embodiments, however, the method embodiments are not intended to be limited thereby.

Although few embodiments of the present invention have been illustrated and described, it would be appreciated by those skilled in the art that changes may be made in these embodiments without departing from the principles and spirit of the present general inventive concept. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein. As used in this disclosure, the term "preferably" is non-exclusive and means "preferably, but not limited to." Terms in the claims should be given their broadest interpretation consistent with the general inventive concept as set forth in this description. For example, the terms "coupled" and "connect" (and derivations thereof) are used to connote both direct and indirect connections/couplings. As another example, "having" and "including", derivatives thereof and similar transitional terms or phrases are used synonymously with "comprising" (i.e., all are considered "open ended" terms)—only the phrases "consisting of" and "consisting essentially of" should be considered as "close ended". Claims are not intended to be interpreted under 112 sixth paragraph unless the phrase "means for" and an associated function appear in a claim and the claim fails to recite sufficient structure to perform such function.

What is claimed is:

1. A method of operating a non-volatile memory device, the method comprising:
providing a first verification voltage to a first memory cell of a plurality of memory cells, the first memory cell to be programmed to a first logic state; and
providing a second different verification voltage to a second memory cell of the plurality of memory cells, the second memory cell to be programmed to the first logic state.

2. The method of claim 1, where the first and second verification voltages are selected responsive to a logic state to be programmed in at least one memory cell adjacent to the first memory cell and adjacent to the second memory cell, respectively.

3. The method of claim 1, where the first and second verification voltages are selected responsive to a logic state to be programmed in at least one memory cell programmed after the first memory cell and after the second memory cell, respectively.

4. The method of claim 1, comprising setting a program fail state for the second memory cell when verifying a program state of memory cells using the first verification voltage, where the second program verification voltage is higher than the first verification voltage.

5. The method of claim 1, where the plurality of memory cells are multi-level memory cells and the first logic state is one of a plurality of logic states.

6. The method of claim 5, where the plurality of memory cells are programmed to the plurality of logic states to represent MSB and LSB data.

7. The method of claim 6, where the plurality of memory cells are indirectly programmed to the plurality of logic states that represent the MSB and LSB data using a prescribed sequence.

8. The method of claim 5, where a second logic state of the plurality of logic states are verified using a third verification voltage and a fourth verification voltage, where the third and fourth verification voltage are different, where the third verification voltage and fourth verification voltage are higher than the first and second verification voltage.

9. The method of claim 5, where a verification voltage for each of a subset of the plurality of logic states is changed into a plurality of predetermined verify voltage levels including at least one lower verify voltage level.

10. The program method of claim 1, where the verification voltages are repeatedly applied in an ascending order, and where when a lower verify voltage level of the repeatedly applied verification voltages corresponding to one logic state is applied, memory cells to be verified using a higher verify voltage level of the repeatedly applied verification voltages corresponding to the one logic state are set to a program fail state.

11. The program method of claim 1, further comprising determining the first verification voltage or the second verification voltage for additional memory cells to be programmed to the first logic state before the programming the additional memory cells.

12. A flash memory device comprising:
an array of memory cells each to store one of a plurality of logic states;
a buffer circuit to write program data in the memory cells; and
a verify level control circuit to change a verify voltage based upon logic states to be programmed in the memory cells and logic states to be programmed in memory cells adjacent to the memory cells.

13. The flash memory device of claim 12, where a verify voltage for a first logic state and a second logic state is changed to a plurality of verify voltage levels that program corresponding memory cells to a plurality of initial different threshold voltage distributions for the first logic state and the second logic state, respectively, where the initial different threshold voltage distributions are respectively combined to a single voltage threshold distribution for the first logic state and the second logic state after programming the array of memory cells, and where a distance between the single threshold voltage distributions corresponding to the first and second logic states is increased.

14. The flash memory device of claim 12, where the verify level control circuit comprises:
a voltage driving part to provide a high voltage in response to a reference voltage; and
a voltage dividing part to divide the high voltage using a variable resistance value to change the verify voltage according to the division result.

15. The flash memory device of claim 14, comprising:
a verify level trim circuit to adjust a reference voltage, the verify level trim circuit to include a plurality of resistors and a plurality of fuses connected in parallel with the resistors, where the buffer circuit comprises,
a compare circuit to compare logic states to be programmed in selected memory cells and logic states to be programmed in memory cells adjacent to the selected memory cells,
a fail control circuit to generate a fail signal based upon the comparison result and a verify voltage provided to the memory cell array, and
a page buffer to set the memory cell to a program fail state in response to the fail signal.

16. The flash memory device of claim 12, comprising a memory system to include:
the flash memory device; and
a controller to control the flash memory device.

* * * * *